United States Patent

Takahashi

[11] Patent Number: 5,155,488
[45] Date of Patent: Oct. 13, 1992

[54] D/A CONVERSION CIRCUIT
[75] Inventor: Hiroyuki Takahashi, Tokorozawa, Japan
[73] Assignee: Pioneer Electronic Corporation, Tokyo, Japan
[21] Appl. No.: 439,941
[22] Filed: Nov. 22, 1989
[30] Foreign Application Priority Data
  May 22, 1989 [JP] Japan .................. 1-128133
[51] Int. Cl.⁵ ............................................. H03M 1/66
[52] U.S. Cl. ..................... 341/144; 341/122; 341/141
[58] Field of Search ............... 341/122, 144, 118, 141; 370/77, 78

[56] References Cited
U.S. PATENT DOCUMENTS

| | | | |
|---|---|---|---|
| 3,588,880 | 6/1971 | Gross et al. .................. | 341/117 |
| 4,677,422 | 6/1987 | Naito .......................... | 341/122 |
| 4,845,498 | 7/1989 | Kubo et al. ................... | 341/122 X |
| 4,864,305 | 9/1989 | Toyama ........................ | 341/122 X |

FOREIGN PATENT DOCUMENTS 0052029  3/1986  Japan ........................... 341/141

Primary Examiner—Sharon D. Logan
Attorney, Agent, or Firm—Wegner, Cantor, Mueller & Player

[57] ABSTRACT

A D/A conversion circuit is provided in which the polarities of a series of input digital data are reversed with every other data block, and the original digital data and the reversed digital data are alterntely D/A converted. An output analong signal is obtained by subtraction between the two D/A converted analog signals.

With the above-mentioned arrangement, the D/A conversion circuit has a dynamic range equivalent to that using two D/A converters even with a single D/A converter.

1 Claim, 5 Drawing Sheets

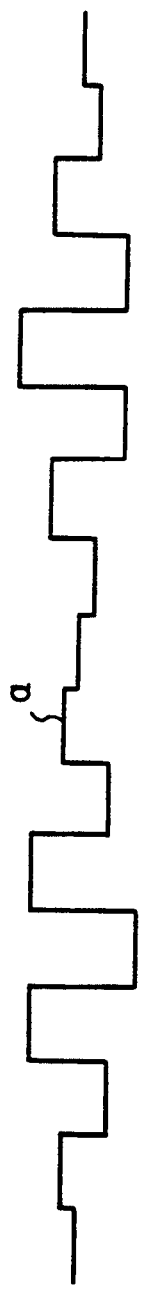
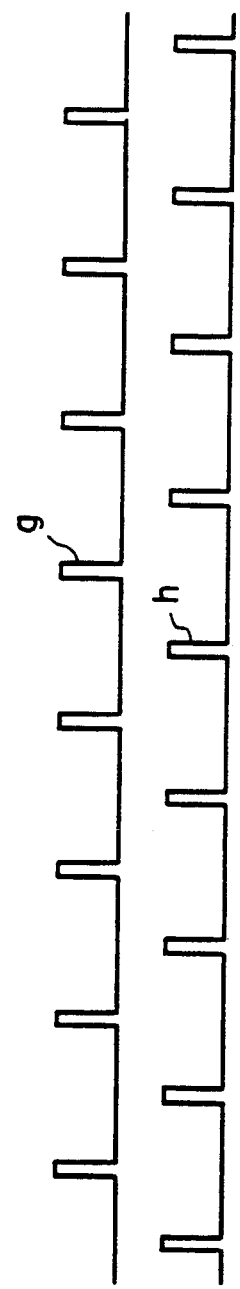
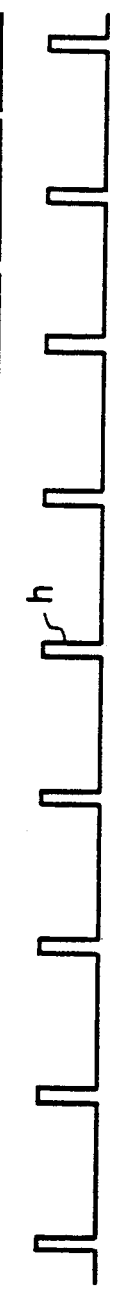
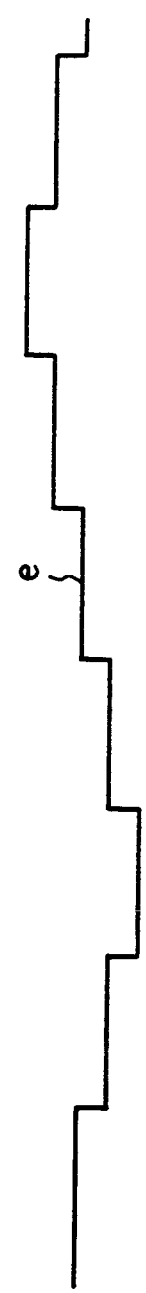
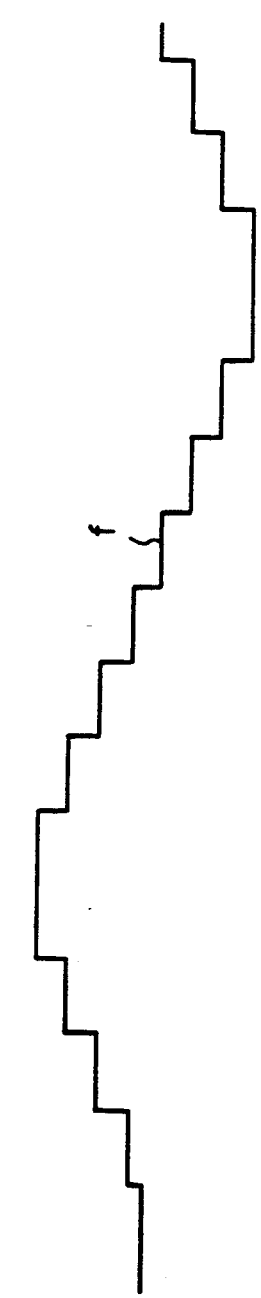
Fig. 4A  
Fig. 4B  
Fig. 4C  
Fig. 4D  
Fig. 4E  
Fig. 4F

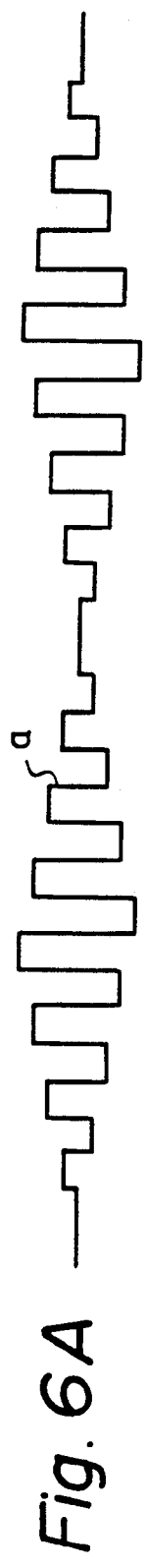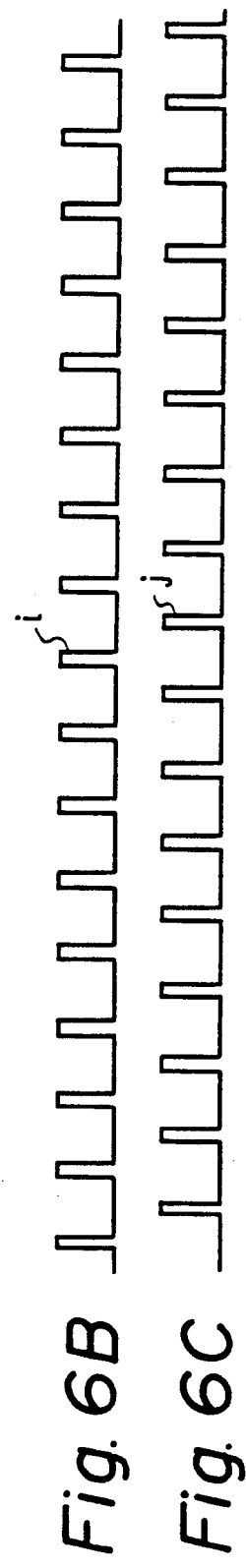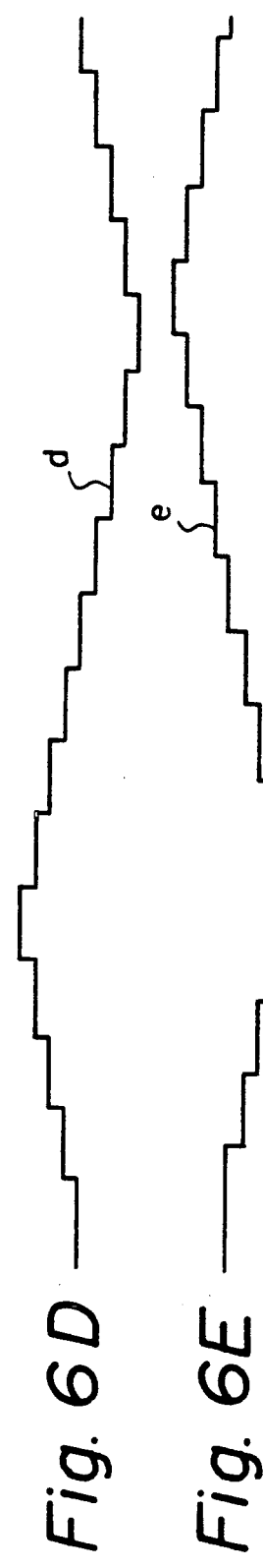
Fig. 6A  Fig. 6B  Fig. 6C  Fig. 6D  Fig. 6E  Fig. 6F

D/A CONVERSION CIRCUIT

BACKGROUND OF THE INVENTION

1. Field of the Invention

The present invention relates to the improvement of a D/A conversion circuit.

2. Description of the Related Art

An example of a conventional D/A conversion circuit is explained in the following, while referring to FIG. 1.

Referring now to FIG. 1, a series of digital data group which bear level signal information such as audio signal data of a 16 bit L or R channel decoded at an audio signal processor of a CD player etc. are supplied to a data controller 1.

The data controller 1 supplies the supplied digital data to a D/A converter 2 as non-reversed data and also it obtains reversed data which are obtained by reversing only the polarity of each block of supplied digital data and supplies the reversed data to a D/A converter 3 in synchronization with the supply of corresponding non-reversed data to the D/A converter 2.

The D/A converter 2 generates an output voltage "a" with a level corresponding to the polarity and the value of the non-reversed data, and supplies it to a sample-hold circuit 4. The D/A converter 3 generates an output voltage "b" with a level corresponding to the polarity and the value of the reversed data, and supplies it to a sample-hold circuit 5.

The sample-hold circuits 4 and 5 receive and hold the output voltages of the D/A converters corresponding to the timing clock pulses "C" corresponding to the data supplied from the data controller 1. The holding output "d" of the sample-hold circuit 4 is supplied to the positive-phase input terminal of a differential amplifier 6, and the holding output "e" of the sample-hold circuit 5 is supplied to the negative phase input terminal of the differential amplifier 6.

The differential amplifier 6 generates a voltage "f" corresponding to the level difference between the two voltages held by the sample-hold circuits 4 and 5.

Next, the operation of a device is described referring to FIG. 2 in the following.

When a series of digital data group are supplied to the data controller 1, the data controller 1 obtains two kinds of data having the same absolute values and opposite polarities concerning the digital data and supplies them to D/A converters 2 and 3. Therefore, the outputs "a" and "b" of the D/A converters 2 and 3 vary complementarily as shown in FIG. 2A and FIG. 2B.

Two outputs "a" and "b" of these D/A converters are held as shown in FIG. 2D and FIG. 2E by sample-hold circuits 4 and 5 which remove glitch noise operating in synchronization with the timing clock pulses "c". The differential amplifier 6 generates an output "f" which is proportional to the level difference between the holding outputs "d" and "e" of sample-hold circuits 4 and 5.

In the arrangement as mentioned in the above, there is a merit that the D/A conversion output "f" has a double dynamic range as shown in FIG. 2F in comparison with the D/A conversion output characteristics when a single D/A converter is used as shown in FIG. 2A.

Two units of expensive D/A converters are used in the above constitution. Four units of D/A converters are needed in total in the case a digital audio device which generally have 2-channel signal processors, which cannot be neglected from the point of view of manufacturing cost. It is also a demerit that when the characteristics of these two D/A converters to be used in a pair are not identical, distortion occurs in the conversion output.

SUMMARY OF THE INVENTION

An object of the present invention is to provide a D/A conversion circuit in which a double dynamic range can be obtained even with a single D/A converter.

To achieve the above-mentioned object, a D/A conversion circuit of a first invention comprises a reversal means for reversing the polarities of every other data block in a series of input digital data group and for supplying them to a D/A converter, sample-hold means for holding two conversion output levels corresponding to input digital data blocks adjacent to each other of the above-mentioned D/A converter, and a subtraction means for obtaining a level difference between the two conversion output levels.

A D/A conversion circuit of a second invention comprises a positive and negative data creation means for alternately supplying reversed data obtained by reversing the polarities of a series of input digital data group and non-reversed data in the input digital data group with every other data block, an sample-hold means for holding two conversion output levels corresponding to the input digital data blocks adjacent to each other of the D/A converter, and a subtraction means for obtaining the level difference between the two conversion output levels.

BRIEF DESCRIPTION OF THE DRAWINGS

FIGS. 4A–4F are explanatory diagrams of the operation of the embodiment. FIGS. 6A–6F are explanatory diagrams of another embodiment.

DETAILED DESCRIPTION OF PREFERRED EMBODIMENTS

Figure 1:
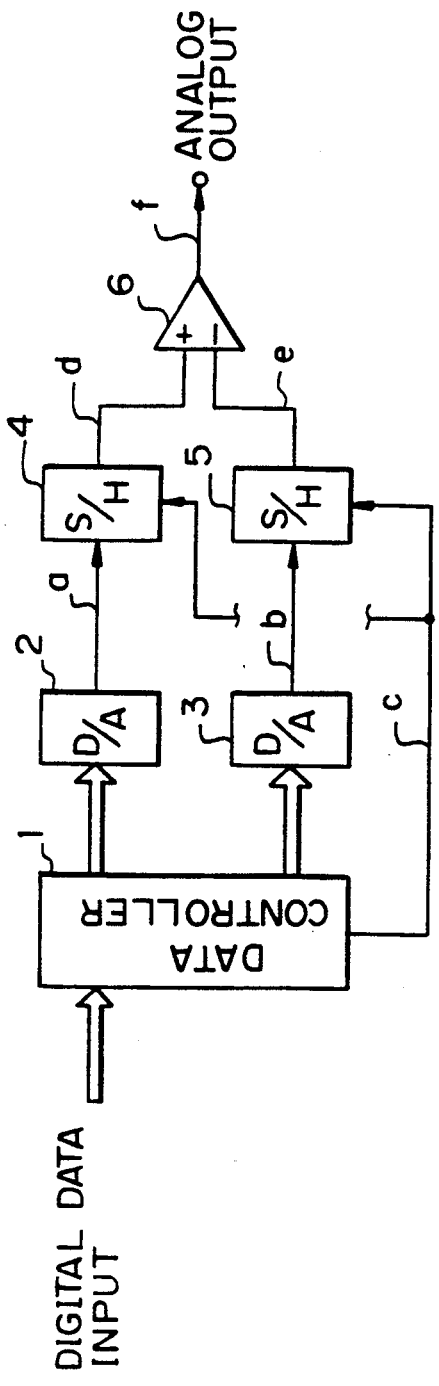
FIG. 1 is a block diagram showing an example of a conventional type device.

An embodiment according to the present invention will be explained referring to FIG. 3 in the following. Similar symbols are given to the parts of a device shown in FIG. 3 which correspond to those of the device shown in FIG. 1.

Figure 3:
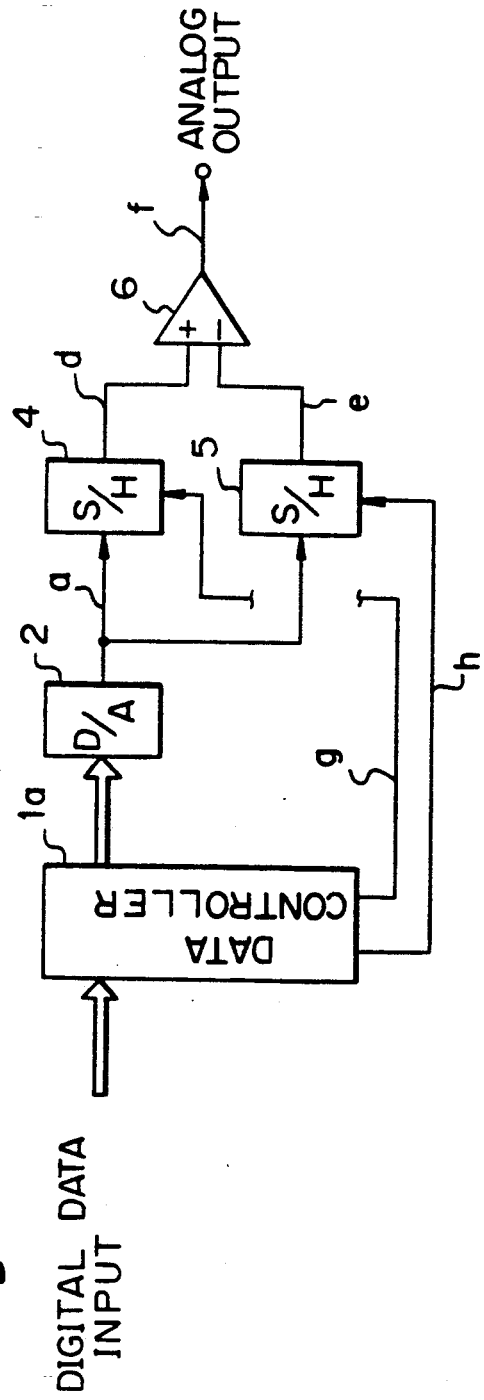
FIG. 3 is a block diagram showing an embodiment of the present invention.

In FIG. 3, a data controller 1a converts the polarities of data blocks with every other block of data in the supplied series of digital data group and supplies them to a D/A converter 2. The D/A converter 2 alternately converts non-reversed data whose polarities are not reversed and reversed data whose polarities are reversed into voltage values, and generates output voltage "a" as shown in FIG. 4A and supply it to sample-hold circuits 4 and 5.

The sample-hold circuit 4 receives and holds the output of the D/A converter 2 corresponding to the supplying condition of non-reversed data to the D/A converter 2 in synchronization with timing clock pulses "g" as shown in FIG. 4B supplied from the data controller 1a. The sample-hold circuit 5 receives and holds the output of the D/A converter 2 corresponding to the supplying condition of reversed data to the D/A converter 2 in synchronization with timing clock pulses "h" as shown in FIG. 4C supplied from the data controller 1a. Therefore the holding outputs "d" and "e" of the sample-hold circuits 4 and 5 corresponding to the output of the D/A converter 2 shown in FIG. 4A are respectively as shown in FIG. 4D and FIG. 4E.

Figures 2A, 2B, 2C, 2D, 2E, 2F:
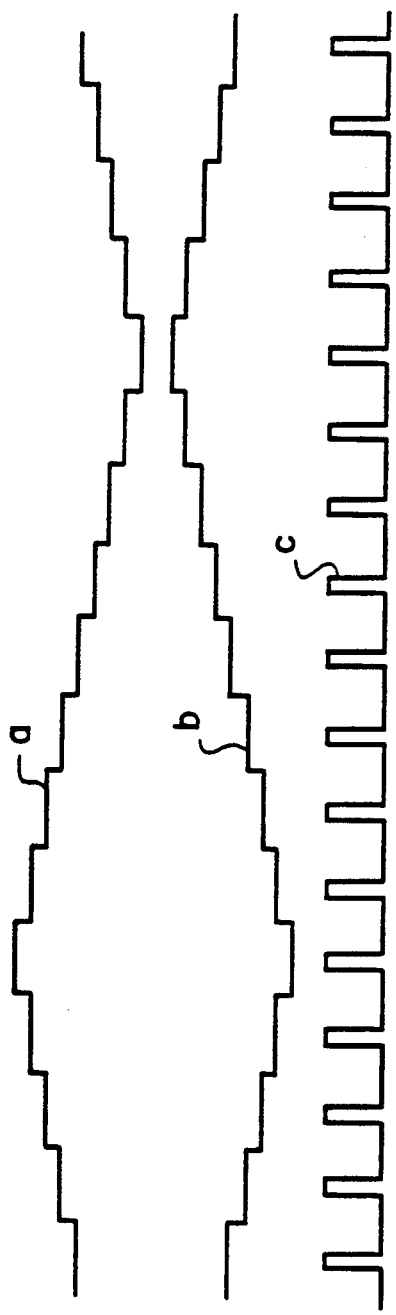
FIGS. 2A–2F are explanatory diagrams of the operation of a conventional type device.

The output "f" of a differential amplifier 6 based on the outputs "d" and "e" of the sample-hold circuits has, as shown in FIG. 4F, a dynamic range in the output level which is double a single D/A converter shown in FIG. 2A.

Another embodiment will be explained while referring to FIG. 5 in the following. Similar symbols are given to the parts of a device shown in FIG. 5 which correspond to those of the device shown in FIG. 3.

Figure 5:
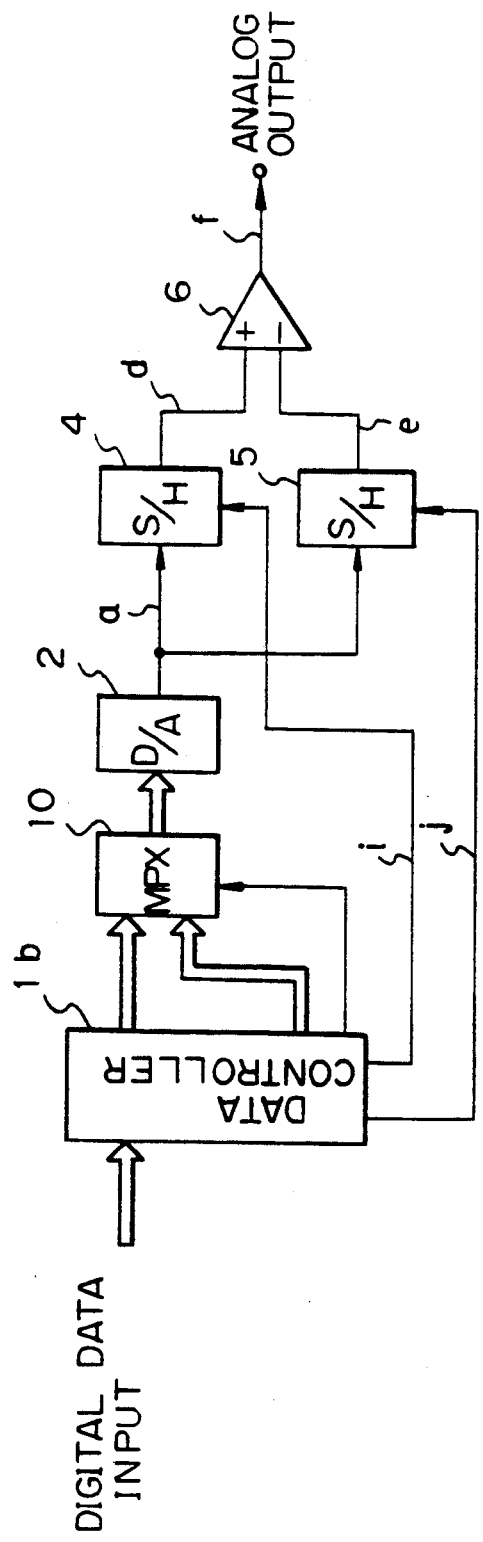
FIG. 5 is a block diagram showing another embodiment.

In FIG. 5, a data controller 1b supplies the supplied digital data to one input terminal of a multiplexer 10 as non-reversed data, and also the data controller 1b obtains the reversed data by reversing only the polarities of the supplied digital data and supplies them to the other terminal of the multiplexer 10 in synchronization with the supply of corresponding non-reversed data to the multiplexer 10.

The multiplexer 10 relays non-reversed data and reversed data alternately to the D/A converter 2 in synchronization with the supply period of input digital data supplied from the data controller 1b and in response to a switching signal having the half period of the supply period. In this way, the digital data quantity supplied to the D/A converter 2 is doubled.

The D/A converter 2 converts the digital data whose polarities are alternately reversed into a voltage "a" as shown in FIG. 6A and supplies it to the sample-hold circuits 4 and 5.

The sample-hold circuit 4 receives and holds the output of the D/A converter 2 in synchronization with timing-clock pulses "i" as shown in FIG. 6B which are generated corresponding to the supplying condition of non-reversed data from the data controller 1b to the multiplexer 10. The sample-hold circuit 5 receives and holds the output of the D/A converter 2 in synchronization with timing-clock pulses "j" as shown in FIG. 6C which are generated corresponding to the supplying condition of reversed data from the data controller 1b to the multiplexer 10. Therefore the holding outputs D and E of sample-hold circuits 4 and 5 corresponding to the output "a" of the D/A converter 2 as shown in FIG. 6A are respectively as shown in FIG. 6D and FIG. 6E.

The output "f" of the differential amplifier 6 based on the outputs "d" and "e" of these sample-hold circuits has a double dynamic range as shown in FIG. 6F and moreover it shows twice oversampled characteristics in comparison with the output of a single D/A converter as shown in FIG. 2A.

With the above-mentioned arrangement according to the present invention using a single D/A converter, the similar or better D/A conversion characteristics can be obtained in comparison with the case where two D/A converters are used as in the case of a conventional device.

It is also possible to make the data controller 1b shown in FIG. 5 have the function of the multiplexer 10 shown in the same drawing.

As described in the above, in a D/A conversion circuit according to the present invention, the polarities of input digital data blocks are alternately reversed and the data are supplied to a single D/A converter to obtain two D/A conversion outputs corresponding to adjacent conversion input data blocks, and the difference between these two conversion outputs is made to be the output of the D/A converter. It is therefore made possible to obtain a double dynamic range of the original dynamic range of a D/A converter by using a single D/A converter and also to provide an economical D/A converter by reason that there is no need to obtain D/A converters of identical characteristics as in the case of conventional devices.

What is claimed is:

1. A D/A conversion circuit for converting an input data signal including consecutive data blocks of constant length into an analog signal, comprising a single D/A converter, polarity reversal means for reversing the polarities of every other one of said data blocks and for supplying the resulting data blocks to said D/A converter, a first sample-holder means for holding a level of a first output signal from said D/A converter in response to a first trigger pulse, a second sample-holder means for holding a level of a second output signal from said D/A converter in response to a second trigger pulse, signal generating means for generating said first and second trigger pulses so that said first and second trigger pulses are generated alternately at intervals equal in length to the lengths of said data blocks, and subtraction means for obtaining a level difference between said output signals from said first and second sample-holder means.

* * * * *